(12) United States Patent
Wu et al.

(10) Patent No.: US 10,134,790 B1
(45) Date of Patent: Nov. 20, 2018

(54) IMAGE SENSOR AND FABRICATION METHOD THEREFOR

(71) Applicant: TAIWAN SEMICONDUCTOR MANUFACTURING COMPANY, LTD., Hsinchu (TW)

(72) Inventors: Cheng-Yi Wu, Taichung (TW); Chun-Chih Lin, Taipei (TW); Jian-Shin Tsai, Tainan (TW); Min-Hui Lin, Chali Township (TW); Wen-Shan Chang, Tainan (TW); Yi-Ming Lin, Tainan (TW); Chao-Ching Chang, Kaohsiung (TW); C. H. Chen, Hsinchu (TW); Chin-Szu Lee, Taoyuan (TW); Y. T. Tsai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/597,521

(22) Filed: May 17, 2017

(51) Int. Cl.
*H01L 27/146* (2006.01)

(52) U.S. Cl.
CPC ...... *H01L 27/1462* (2013.01); *H01L 27/1463* (2013.01); *H01L 27/14621* (2013.01); *H01L 27/14627* (2013.01); *H01L 27/14636* (2013.01); *H01L 27/14645* (2013.01); *H01L 27/14685* (2013.01); *H01L 27/14687* (2013.01); *H01L 27/14689* (2013.01)

(58) Field of Classification Search
CPC ..... H01L 2924/12043; H01L 27/14636; H01L 27/14627; H01L 27/1464; H01L 2224/0391; H01L 2224/04042; H01L 24/03; H01L 27/14689; H01L 27/14603; H01L 27/14634; H01L 27/14643; H01L 27/1462; H01L 27/14687; H01L 27/14685; H01L 27/14645; H01L 27/1463; H01L 27/14621
USPC ....................................................... 257/292
See application file for complete search history.

(56) References Cited

U.S. PATENT DOCUMENTS

| | | | | |
|---|---|---|---|---|
| 2008/0237766 A1* | 10/2008 | Kim | ................. | H01L 27/14627 257/432 |
| 2012/0292728 A1* | 11/2012 | Tsai | ..................... | H01L 27/1464 257/435 |
| 2017/0117316 A1* | 4/2017 | Hsu | ......................... | H01L 24/05 |

* cited by examiner

*Primary Examiner* — Caleen Sullivan
(74) *Attorney, Agent, or Firm* — Hauptman Ham, LLP (57) ABSTRACT

A method of fabricating an image sensor includes depositing a first dielectric layer over a substrate, removing a portion of the first dielectric layer from the substrate to form a trench, depositing a conductive layer over the first dielectric layer and in the trench, forming a protective layer lining a top surface of the conductive layer and sidewalls and a bottom surface of the groove in the conductive layer, and removing a portion of the conductive layer to form a grid structure. A groove corresponding to the trench is formed in the conductive layer.

20 Claims, 7 Drawing Sheets

IMAGE SENSOR AND FABRICATION METHOD THEREFOR

BACKGROUND

Semiconductor image sensors are used to detect radiation such as visible light. A complementary metal-oxide-semiconductor (CMOS) image sensor (CIS) and charge-coupled device (CCD) are applied in various applications such as cameras, mobile phones, and laptops for image capturing. The CIS utilizes an array of pixels in a substrate, including transistors and photodiodes to absorb photons projected toward the substrate and convert the photons into an electrical charge. Analog signals resulting from the electrical charge are amplified and an analog-to-digital converter converts the amplified signals into digital signals. Subsequently, a plurality of processes of color interpolation such as color correction, gamma correction and white balance are performed for image saving or compressing.

In comparison with a front side illumination CIS (FSI-CIS), a back side illumination CIS (BSICIS) allows incident light to penetrate from a back side of a substrate, i.e., a side opposite to an interconnect structure. In such a way, image sensor operation improves because the BSICIS captures more photons of an image signal than the FSICIS due to reduced reflection of incident light by the interconnect structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures.

In an image sensor, as radiation detection device feature sizes have decreased to be smaller in order to reduce pixel pitch, i.e., a distance between neighboring pixels, an array of pixels is closer to a surrounding peripheral black level correction (BLC) and/or circuitry. As a result of the reduced dimensions, manufacturing of the image sensor increases a risk of electrical discharge arcing and damaging a surface of a semiconductor wafer or a processing chamber. For example, during a plasma-enhanced process, such as plasma-enhanced chemical vapor deposition (PECVD) or reactive ion etching (RIE), a corner of a conductive layer provides a pathway to move electrical charges to produce a localized charge imbalance in dielectric layers under the conductive layer, thereby causing defects such as cracking in the semiconductor wafer. Consequently, manufacturing costs increase due to a poor reliability and reduced production yield. In some approaches, a dielectric layer is formed over the conductive layer to protect the corner of the conductive layer and to help prevent arcing from being induced during the plasma-enhanced process or under a strong electrical field. The dielectric layer further smooths a surface of the conductive layer and helps to reduce an arcing phenomenon caused by contamination of the semiconductor wafer. In some embodiments, the dielectric layer is formed in a dark region of the image sensor, i.e., incident light is blocked by a shielding structure. In some embodiments, the dielectric layer is formed in a pixel region of the image sensor.

Figure 1:
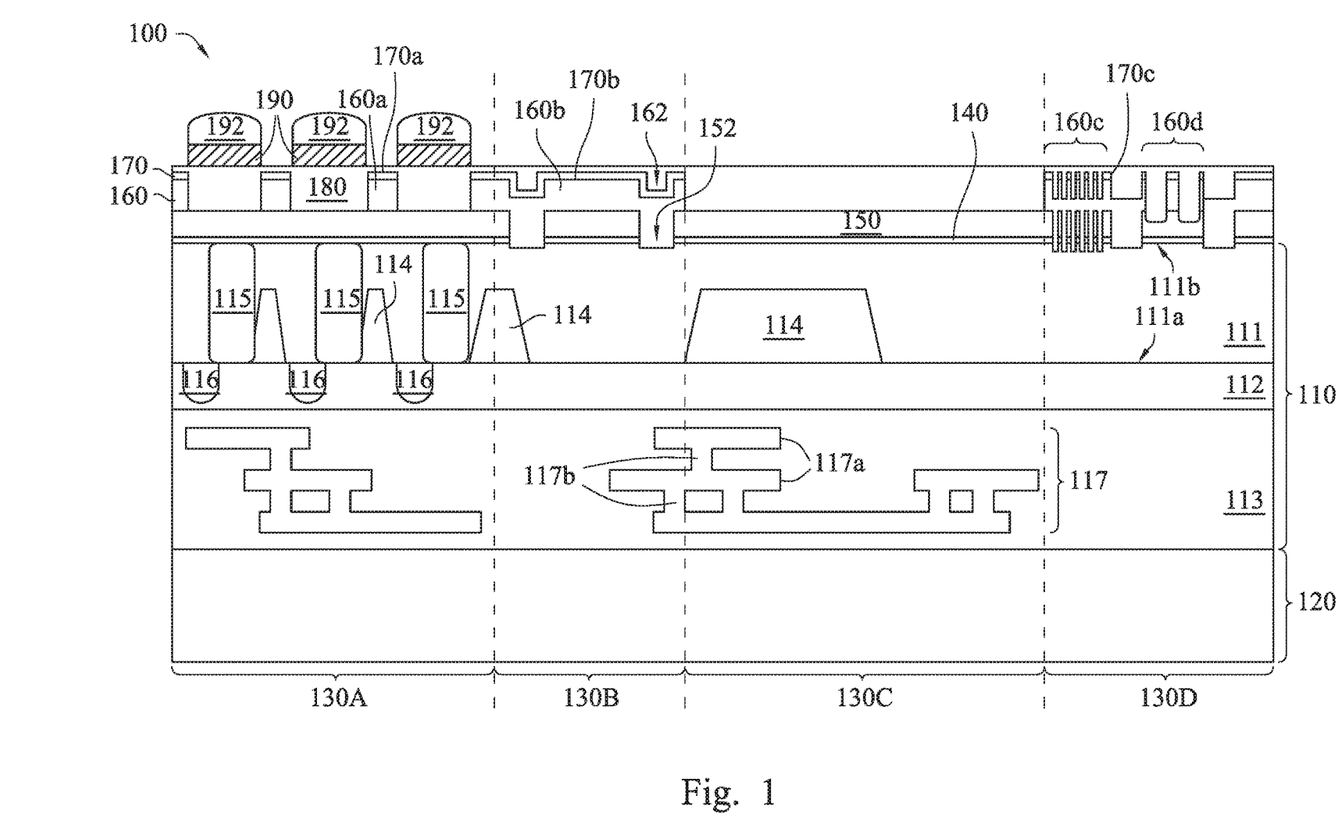
FIG. 1 is a cross-sectional view of an image sensor in accordance with one or more embodiments.

FIG. 1 is a cross-sectional view of an image sensor 100 in accordance with one or more embodiments. Image sensor 100 includes a device substrate 110 and a carrier substrate 120. Device substrate 110 is bonded on carrier substrate 120. Image sensor 100 further includes a pixel region 130A, a dark region 130B, a conductive pad region 130C and a cutting region 130D. Pixel region 130A has an array of image pixels where for each image pixel a majority of a pixel area is occupied by a light sensing element. In some embodiments, due to a shield structure used to block incident light, dark region 130B has an element associated with BLC in order to determine a baseline of a level of brightness for image sensor 100. In some embodiments, pixel region 130A is in a center portion of an integrated circuit (IC) chip and dark region 130B is at an edge of pixel region 130A. The IC chip is configured to detect incident light and record intensity of the detected light. In some embodiments, dark region 130B is surrounded by four pixel regions 130A. In some embodiments, dark region 130B includes logic circuitry and/or analog circuitry to process signals received by the light sensing element. In some embodiments, conductive pad region 130C surrounds pixel region 130A and dark region 130B along a periphery of the IC chip, and cutting region 130D, also referred to as a scribe line, is between adjacent IC chips.

Device substrate 110 further includes multiple layers such as a workpiece 111, an inter-layer dielectric (ILD) 112 and an inter-metal dielectric (IMD) 113. ILD 112 is between workpiece 111 and IMD 113. Workpiece 111 has a first side 111a, also referred to as a front side, and a second side 111b, also referred to as a back side. In some embodiments, workpiece 111 has a fin structure extending from first side 111a of workpiece 111 away from second side 111b. Workpiece 111 includes a bulk semiconductor material, such as silicon, germanium, silicon-germanium, silicon-carbide, III-V compounds or another suitable material. In some embodiments, workpiece 111 is a silicon on insulator layer (SOI) substrate or a silicon on sapphire (SOS) substrate. Multiple isolation structures 114 extend from first side 111a of workpiece 111. In pixel region 130A, a radiation detection device 115 and a transistor 116 are between adjacent isolation structures 114. In some embodiments, radiation detection device 115 is also referred to as a light sensing element. Radiation detection device 115 is a diode-type detector or a gate-type detector, in some instances. Radiation detection device 115 is configured to absorb radiation to generate charges or photo-electrons which are accumulated and collected in a radiation sensing region of radiation detection device 115. Each combination of radiation detection device 115 and transistor 116 represents an image pixel unit in the array of image pixels. When transistor 116 is turned on, radiation detection device 115 is coupled to a source/drain feature of transistor 116 and drives charges generated by radiation detection device 115 to flow from one source/drain feature to the other in order for the charge to be read out. In some embodiments, transistor 116 is referred to as a transfer transistor.

ILD 112 is on first side 111a of workpiece 111 and is under isolation structures 114, radiation detection device 115 and transistor 116. A plurality of contact plugs (not shown) are in the ILD 112 to establish an electrical connection with radiation detection device 115 and transistor 116. IMD 113 is over ILD 112 and includes an interconnect structure 117, which is electrically connected to transistor 116 through the contact plugs. In some embodiments, ILD 112 includes silicon oxide, silicon nitride, silicon oxynitride, tetraethylorthosilicate (TEOS), doped silicate glass, polymide or another suitable material. In some embodiments, ILD 112 and IMD 113 include a same low dielectric constant material. The low dielectric constant material has a dielectric constant smaller than 3, in some instances. In some embodiments, ILD 112 and IMD 113 include different low dielectric constant materials. Interconnect structure 117 includes multiple conductive lines 117a and multiple via plugs 117b connecting one or more of the conductive lines 117a.

Image sensor 100 further includes a charge accumulation layer 140, a buffer layer 150, a conductive layer 160, a protective layer 170, a passivation layer 180, color filters 190 and microlenses 192. Charge accumulation layer 140 is on second side 111b of workpiece 111. In some embodiments, a silicon oxide layer (not shown) is between charge accumulation layer 140 and workpiece 111. Charge accumulation layer 140 accumulates negative charges or positive charges based on various manufacturing designs. As an example, when charge accumulation layer 140 includes a material for trapping negative charges, positive charges accumulate at an interface between workpiece 111 and charge accumulation layer 140. In some embodiments, charge accumulation layer 140 acts as an anti-reflective coating (ARC) layer to reduce reflection of incident light to be detected by radiation detection device 115. In some embodiments, charge accumulation layer 140 includes a high dielectric constant material. The high dielectric constant material has a dielectric constant higher than 7, in some instances. Buffer layer 150 is over charge accumulation layer 140. In some embodiments, buffer layer 150 includes a dielectric material. In dark region 130B, a portion of buffer layer 150, a portion of charge accumulation layer 140 and a portion of workpiece 111 are removed to form a trench 152. In some embodiments, a portion of buffer layer 150, charge accumulation layer 140 and workpiece 111 are removed in cutting region 130D to form an alignment mark in order for measurement of alignment accuracy between two adjacent layers.

Each of conductive layers 160a-d (collectively referred to as conductive layer 160) is over buffer layer 150. In pixel region 130A, conductive layer 160a includes a grid structure. In some embodiments, the grid structure has a 64×64 array or a 128×128 array. In dark region 130B, in order to be coupled to ground or connected a reference voltage to release charges from conductive layer 160a, a portion of conductive layer 160b is in trench 152 and extends toward workpiece 111. That is, a portion of conductive layer 160b extends perpendicularly with respect to second side 111b and contacts workpiece 111. A groove 162 in conductive layer 160b is therefore formed corresponding to trench 152. Conductive pad region 130C is substantially free of conductive layer 160. Cutting region 130D includes multiple trenches which have a same thickness as trench 152. For example, grooves formed in conductive layer 160c and conductive layer 160d are used to execute alignment correction and to determine a degree of misalignment during a photolithography process. In some embodiments, conductive layer 160c is referred to as a scribe lane primary mark (SPM) and conductive layer 160d is referred to as an overlay (OVL). In some embodiments, cutting region 130D further includes a testkey system for testing electrical characteristics associated with semiconductor devices.

Protective layers 170a-c (collectively referred to as protective layer 170) are over conductive layer 160. In pixel region 130A, protective layer 170a is over conductive layer 160a. In dark region 130B, protective layer 170b is over conductive layer 160b, lining along sidewalls and a bottom surface of groove 162. In at least one embodiment, contact pad region 130C is free of protective layer 170. In cutting region 130D, protective layer 170c is over conductive layers 160c-d. By covering at least a portion of a corner of conductive layer 160b, protective layer 170 helps to prevent an occurrence of arcing during subsequent processes, for example, during a plasma-enhanced etch process, thereby reducing an amount of discarded wafers because of manufacturing variation (i.e., wafer scrap).

Passivation layer 180 is over protective layer 170, conductive layer 160 and buffer layer 150. In some embodiments, passivation layer 180 is over an entirety of a wafer to provide passivation for the devices. Passivation layer 180 includes, but is not limited to, silicon oxide, silicon nitride, silicon oxynitride, TEOS, phosphosilicate glass (PSG), boronphosphosilicate glass (BPSG), carbon doped silicon oxice, zirconium oxide, aluminum oxide, parylene, polymide, other suitable material or a combination thereof. The formation of passivation layer 180 includes physical vapor deposition (PVD), chemical vapor deposition (CVD), spin-on-dielectric (SOD), sputtering or another suitable process. Color filters 190 are in pixel region 130A and over passivation layer 180. Each of color filters 190 is used to pass through incident light having a predetermined waveband. For example, color filters 190 filter through visible light of a red waveband, a green waveband or a blue waveband to each radiation detection device 115. In some embodiments, color filters 190 include a dye-based (or pigment-based) polymer for passing a predetermined waveband. In some embodiments, color filters 190 include a resin or an organic-based material having color pigments. In some embodiments, an anti-reflective layer is between passivation layer 180 and color filters 190. The anti-reflective layer includes at least one dielectric material, such as silicon nitride, silicon oxynitride or silicon carbon. Microlenses 192 are in pixel region 130A and over color filters 190, and each pair of microlens 192 and color filter 190 is aligned with a radiation detection device 115 in order to focus incident light onto a corresponding radiation detection device 115. One of ordinary skill in the art would understand that microlens 192 has various shapes and sizes based on an index of refraction of a material and/or a distance between microlens 192 and radiation detection device 115, in some embodiments. In some embodiments, microlens 192 is between passivation 180 and color filter 190.

Figure 2:
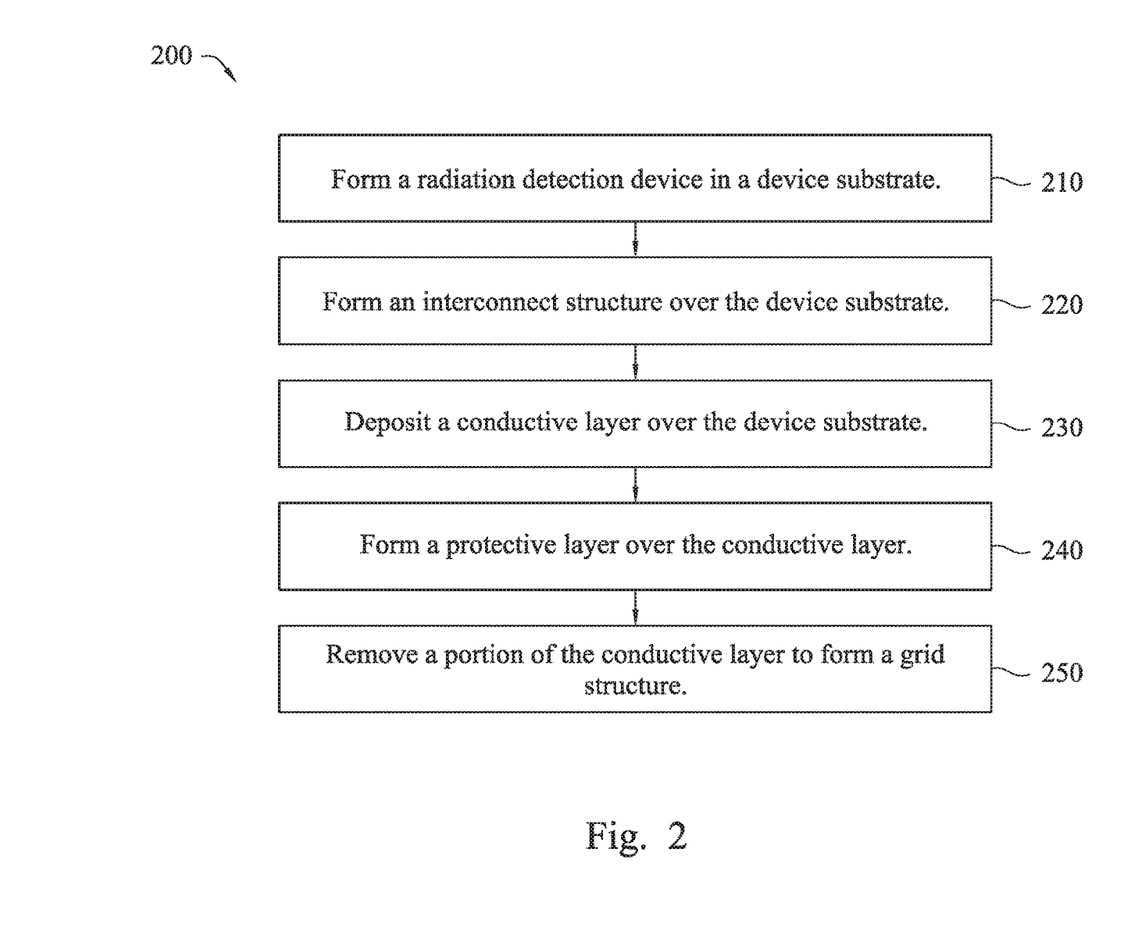
FIG. 2 is a flow chart of a method of fabricating an image sensor in accordance with one or more embodiments.

FIG. 2 is a flowchart of a method 200 of fabricating an image sensor in accordance with one or more embodiments. One of ordinary skill in the art would understand that additional operations are able to be performed before, during, and/or after method 200, in some instances. Method 200 includes operation 210 in which a radiation detection device, e.g., radiation detection device 115 in FIG. 1, is formed in a device substrate, e.g., device substrate 110 in FIG. 1. The device substrate has two sides opposite to each other, and the radiation detection device is at a same side with an isolation structure, such as a shallow trench isolation (STI). In some embodiments, the radiation detection device is a diode-type detector including a p-type layer as a p-type side of a photo diode and an n-type layer as an n-type side of the photo diode form a p-n junction for transforming photons into electrons. In some embodiments, the formation of the radiation detection device includes a doping process. In some embodiments, the formation of the radiation detection device includes a selective epitaxy growth (SEG) and in-situ doping process. In some embodiments, after the formation of the radiation detection device, at least one transistor is formed over the device substrate in order to make an image pixel.

Method 200 continues with operation 220 in which an interconnect structure, e.g., interconnect structure 117 in FIG. 1, is formed over the device substrate. The interconnect structure is formed at a same side of the device substrate as the radiation detection device and is formed in multiple dielectric layers, for example, an ILD and an IMD. The formation of the ILD and IMD includes a deposition process, such as PVD, CVD, SOD, sputtering or another suitable process. The interconnect structure is coupled to various components of the transistor and the radiation detection device so that the image sensor is able to transfer signals based on the received incident light to other circuitry with the IC chip. In some embodiments, the interconnect structure includes vertical components substantially perpendicular to a front surface of the device substrate, such as contact plugs, via plugs and horizontal components substantially parallel to the front surface of the device substrate, such as metal lines. The formation of the interconnect structure includes a deposition process, such as PVD, CVD, sputtering, electroplating or another suitable process. The formation further includes a lithography process and an etch process to define the vertical and horizontal components. For example, in some embodiments where the interconnect structure has a via plug and a metal line, a single damascene methodology or a dual damascene methodology is applied. The interconnect structure includes aluminum, copper, aluminum/copper alloy, tungsten, titanium, tantalum, metallic silicide or combinations thereof.

Method 200 continues with operation 230 in which a conductive layer, e.g., conductive layer 160, is deposited over the device substrate. In some embodiments, the conductive layer is blanket deposited in a pixel region, a dark region, a conductive pad region and a cutting region of the device substrate. In some embodiments, the deposition of the conductive layer is selectively blocked in the conductive pad region. In some embodiments, the conductive layer is formed at a same side of the device substrate as the interconnect structure. In some embodiments, the conductive layer is formed at a different side of the device substrate from the interconnect structure. In some instances where the conductive layer and the interconnect structure are formed at different sides, a carrier substrate is bonded over the interconnect structure. That is, the interconnect structure is between the device substrate and the carrier substrate. The formation of the conductive layer includes a deposition process, such as PVD, sputtering or another suitable process. In some embodiments, the conductive layer includes tungsten, titanium nitride, aluminum/copper alloy, aluminum, copper molybdenum or a combination thereof. A charge accumulation layer and a buffer layer are deposited between the conductive layer and the interconnect structure. A portion of the buffer layer, the charge accumulation layer and the device substrate are removed to form a trench in the dark region. In some embodiments where the charge accumulation layer is formed at a same side of the device substrate as the interconnect structure, a portion of the IMD is removed to form a trench in the dark region. Therefore, when depositing the conductive layer over the buffer layer, a portion of the conductive layer fills the trench and concaves toward the device substrate. As a result, the portion of the conductive layer is in direct contact with the device substrate and helps to release charges collected and accumulated in the pixel region during subsequent process(es). In at least one embodiment, a portion of the buffer layer, the charge accumulation layer and the device substrate in the pixel region are removed to form a plurality of trenches in rows and in columns. In such a way, the conductive layer filled in the plurality of trenches helps to prevent incident light in any one image pixel from scattering and reaching any neighboring image pixel.

Method 200 continues with operation 240 in which a protective layer, e.g., protective layer 170, is lined over the conductive layer. That is, where a groove is formed in the conductive layer, the protective layer continuously extends along a top surface of the conductive layer, and sidewalls and a bottom surface of the groove. In some embodiments, the formation of the protective layer includes thermal oxidation, atomic layer deposition (ALD), high aspect ratio process (HARP), pulse laser deposition, photo induced chemical vapor deposition (PICVD), evaporation, atmospheric pressure CVD (APCVD), low pressure CVD (LPCVD) or another suitable process. In some embodiments, the protective layer includes one or more dielectric materials, such as tungsten oxide, aluminum oxide, molybdenum oxide, silicon oxide, silicon oxynitride, hydrocarbon, another suitable material or a combination thereof. In comparison with other approaches which use a plasma-enhanced deposition process to form a protective layer, a non-plasma-enhanced deposition helps to avoid arcing induced defects and improve device reliability and production yield.

In some embodiments where the conductive layer includes tungsten and the protective layer is formed by HARP, an oxygen-containing gas with a flow rate ranging from about 1000 standard cubic centimeters per minute (sccm) to about 27000 sccm is applied to help the conductive layer to be involved in an oxygen-enriched ambience. For example, the oxygen-containing gas uses oxygen at a range from about 3000 sccm to about 25000 sccm and ozone at a range from about 1000 sccm to about 27000 sccm. In some embodiments, a chamber temperature is raised in a range from about 300 degrees Celsius to about 600 degrees Celsius and a chamber pressure is adjusted in a range from about 500 Torr to about 700 Torr. In such a way, a tungsten oxide layer has a thickness ranging from about 20 angstrom (Å) to about 80 Å. A smaller thickness increases a risk of arcing induced defects, in some instances. A greater thickness increases a manufacturing cost without a significant improvement in functionality, in some instances. In comparison with other approaches, at least one of a conformity, a step sidewall coverage and a bottom sidewall coverage using HARP or ALD is greater than 95%.

Method 200 continues with operation 250 in which a portion of the conductive layer is removed to form a grid structure. The removal of the conductive layer includes a photolithography process and an etch process. The etch process includes a dry etching or a wet etching. Accordingly, the two-dimensional grid structure is formed in the pixel region and each pixel is separated by the grid structure. In the cutting region, alignment marks such as SPM or OVL are formed for measuring accuracy of the alignment. In some embodiments, before the photolithography process, an ash-removable dielectric (ARD) is deposited over the conductive layer to form a hard mask layer. The ARD includes a light-absorption layer and a phase shifter in order to help avoid light reflection. In some embodiments, an anti-reflective coating (ARC) layer, such as a bottom anti-reflective coating (BARC) is formed between the protective layer and the ARD. After the etch process, the ARD is substantially removed from the conductive layer and, in the pixel region, the protective layer is over a top surface of the conductive layer. In the dark region, the protective layer is over a top surface of the conductive layer and along sidewalls of the concaved conductive layer. In comparison with other approaches which do not have the protective layer, a corner of the conductive layer is covered by the protective layer, thereby reducing an arching during a subsequent deposition process and/or an etch process.

One of ordinary skill in the art would understand that additional operations are included in method 200, such as a passivation layer is deposited after operation 250. As another example, a dielectric layer is selectively formed along sidewalls of the trench before operation 240 while a bottom surface of the trench is exposed. In such a way, the excess charges collected and accumulated in the pixel region, which tend to neutralize opposite charges in the charge accumulation layer, will be separated by the dielectric layer, resulting in a reduced dark current and improved image resolution. As another example, a spacer layer is formed over the color filter to help maintain the focal length of the incident light from the microlens to the radiation detection device.

Figure 3A:
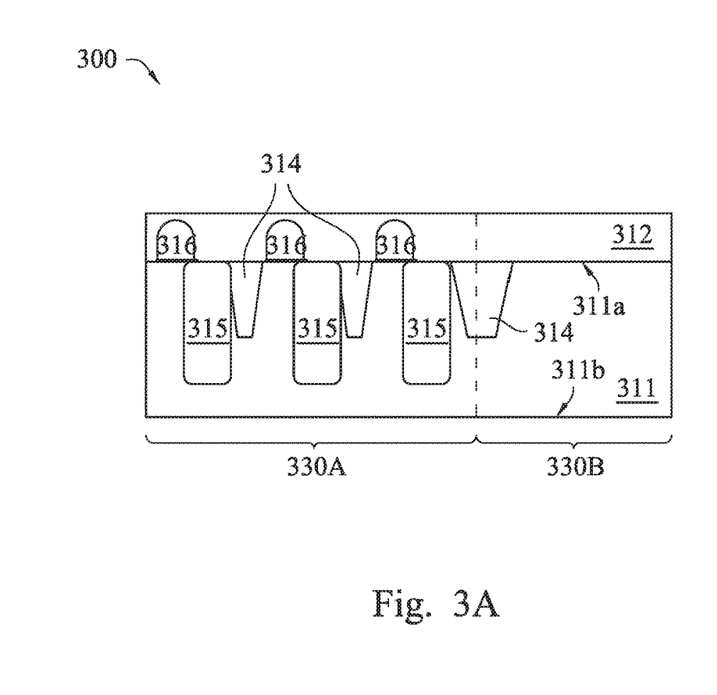
FIGS. 3A-3G are cross-sectional views at various stages of manufacturing an image sensor in accordance with one or more embodiments.

FIGS. 3A-3F are cross-sectional views at various stages of fabricating an image sensor 300 in accordance with one or more embodiments. Image sensor 300 includes elements similar to image sensor 100 and a last two digits of like elements are the same. FIG. 3A is a cross-sectional view of image sensor 300 following operation 210. Image sensor 300 includes a device substrate 311, an ILD 312, an isolation structure 314, a photo detection device 315 and a transistor 316. Device substrate 311 has a front surface at first side 311a and a back surface at second side 311b. ILD 312, isolation structure 314, photo detection device 315 and transistor 316 are formed at the first side 311a. In some embodiments, each photo detection device 315 is formed adjacent to one isolation structure 314, and each photo detection device 315 is coupled to a source/drain feature of one transistor 316 to form an image pixel. In some embodiments, each photo detection device 315 is coupled to multiple transistors. For example, in a four transistor (4T) active pixel sensor (APS), each photo detection device 315 is coupled to a transfer transistor, a reset transistor, a source follower transistor and a select transistor. In some embodiments, a thickness of photo detection device 315 is greater than a thickness of isolation structure 314. In some embodiments wherein photo detection device 315 includes stacked layers, a thickness of t photo detection device 315 is greater than the thickness of isolation structure 314. One of ordinary skill in the art would recognize that a pixel region 330A and a dark region are labeled in FIG. 3A for clarity and image sensor 300 further includes a conductive pad region and a cutting region.

Figure 3B:
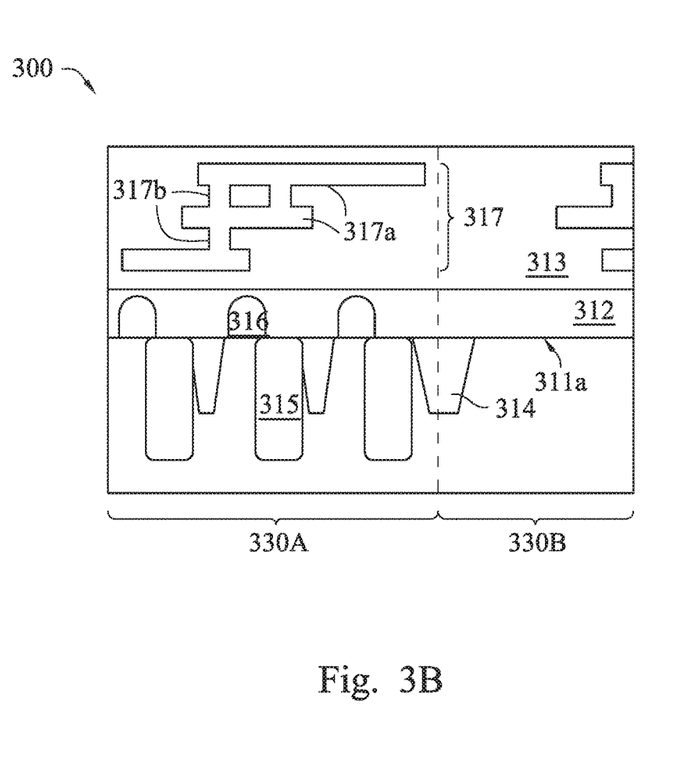

FIG. 3B is a cross-sectional view of image sensor 300 following operation 220. An interconnect structure 317 includes horizontal components 317a and vertical components 317b are formed over device substrate 310. Interconnect structure 317 has conductive layers extending from a bottom layer to a top layer formed in an IMD 313. The formation of IMD 313 includes PVD, CVD, SOG or another suitable process. In some embodiments, IMD 313 includes a low dielectric constant dielectric material. One or more passivation layers used to help protect devices and interconnect structures from damage and contamination are formed over IMD 313.

Figure 3C:
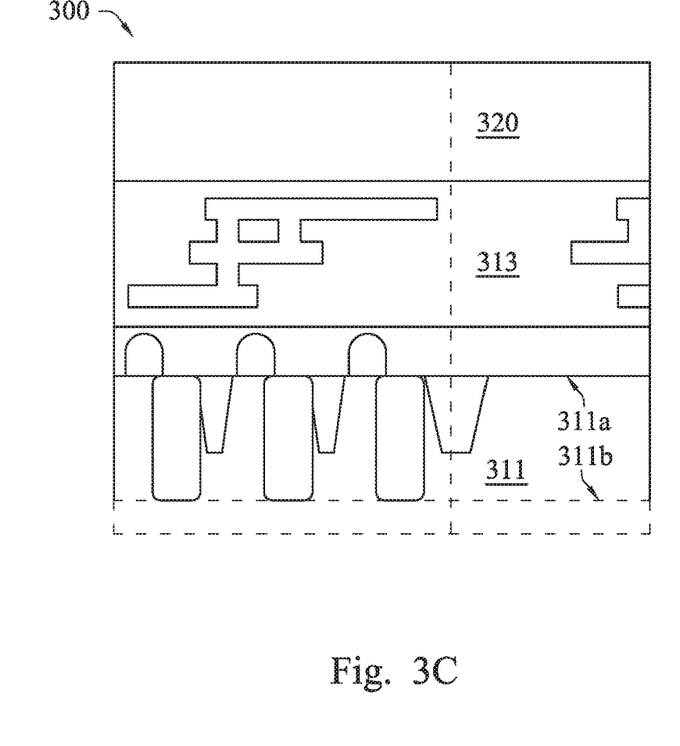

FIG. 3C is a cross-sectional view of image sensor 300 after the formation of interconnect structure. In some embodiments where image sensor 300 is a BSICIS, a carrier substrate 320 is bonded to first side 311a of device substrate 310. The bonding technique includes metal diffusion, anodic bonding or molecular force methodology. Carrier substrate 320 helps to protect various components formed at first side 311, such as radiation detection device 315 and transistor 316. After being bonded to carrier substrate 320, device substrate 310 is flipped and a thinning process is performed at second side 311b. The thinning process includes a mechanical grinding process, a chemical thinning process or a combination thereof. In some embodiments, a thickness of thinned device substrate 310 is in a range from about 2 micrometers (µm) to about 5 µm. A smaller thickness increases a risk of damaging the components in device substrate 310, in some instances. A greater thickness increases difficulty of manufacturing through vias in a subsequent process, in some instances. Carrier substrate 320 further helps to provide mechanical strength and support for processing second side 311b of device substrate 310. In some embodiments, carrier substrate 320 includes a same material as device substrate 310. In some embodiments, carrier substrate 320 includes a different material from device substrate 310. In order to provide an electrical isolation between device substrate 310 and carrier substrate 320, in some embodiments a buffer layer is formed between device substrate 310 and carrier substrate 320.

Figure 3D:
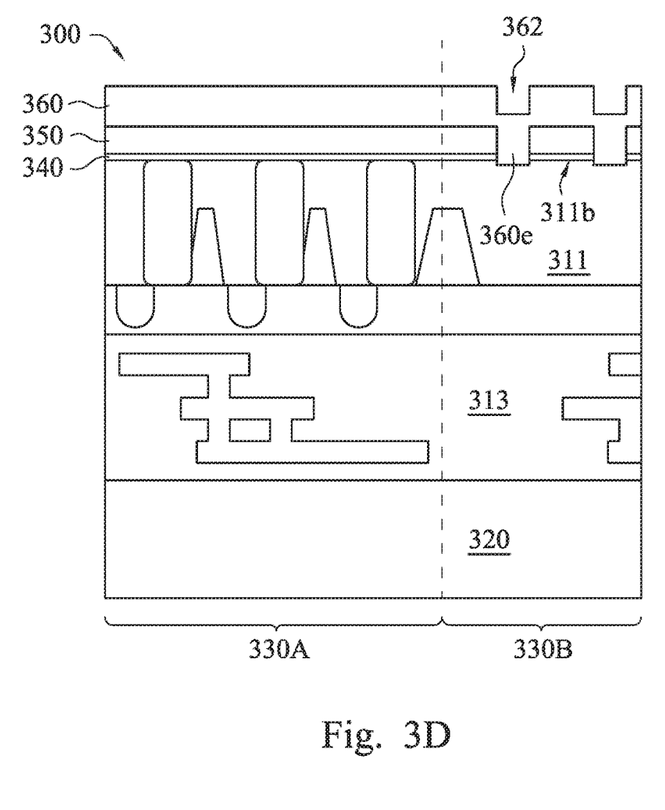

FIG. 3D is a cross-sectional view of image sensor 300 following operation 230. In some embodiments where image sensor 300 is a BSICIS, a charge accumulation layer 340 and a buffer layer 350 are blanket deposited at second side 311b of device substrate 311. Accumulation layer 340 helps to accumulate negative or positive charges in device substrate 310 to an interface between charge accumulation layer 340 and device substrate 310 to form electric dipoles, which functions as a carrier barrier to trap defects such as dangling bonds. In some embodiments where device substrate 310 includes silicon, a silicon oxide layer is formed before the deposition of accumulation layer 340. A thickness of accumulation layer 340 ranges from about 400 Å to about 650 Å. A greater thickness blocks more incident light, reducing an efficiency of image sensor 300, in some instances. A smaller thickness increases dark currents, resulting in a reduced resolution, in some instances. Charge accumulation layer 340 includes one or more dielectric materials, such as a combination of hafnium oxide with a thickness around 60 Å and tantalum oxide with a thickness around 500 Å. Buffer layer 350 includes one or more dielectric materials is formed over charge accumulation layer 340. In some embodiments, buffer layer 350 includes a first layer having a thickness from about 1000 Å to about 2500 Å and a second layer having a thickness from about 300 Å to about 800 Å. The first layer and the second layer includes plasma-enhanced oxide (PEOX), plasma-enhanced tetra ethyl oxysilane (PETEOS), another suitable material or a combination thereof. The formation of buffer layer 350 includes PECVD, high density plasma CVD (HDPCVD) or another suitable process. In some embodiments, a third layer including low deposited rate resistor protection oxide (LRPO) is formed between the first layer and second layer.

Next, at least a portion of buffer layer 350, charge accumulation layer 340 and device substrate 311 are removed to form a trench 352 in dark region 330B. In some embodiments, a portion of buffer layer 350 in pixel region 330A is also removed to form a plurality of trenches in rows and columns. In some embodiments, the plurality of trenches in rows and columns has a same depth as trench 352. A conductive layer 360 is then deposited over buffer layer 350 and filled in trench 352. In order to help release charges accumulated in pixel region 330A and/or charges induced during manufacturing process(es), in dark region 330B, a portion of conductive layer 360e corresponds to trench 352 concaves toward and directly contacts device substrate 311. A groove 362 is therefore formed in conductive layer 360. In some embodiments, the deposition of conductive layer 360 includes PVD, CVD, sputtering, electroplating or another suitable process. In some embodiments, conductive layer 360 includes tungsten, aluminum, copper, aluminum/copper alloy titanium or another suitable material. In at least one embodiment, conductive layer 360 includes titanium nitride having a thickness from about 200 Å to about 400 Å and tungsten having a thickness from about 1500 Å to 3000 Å.

Figure 3E:
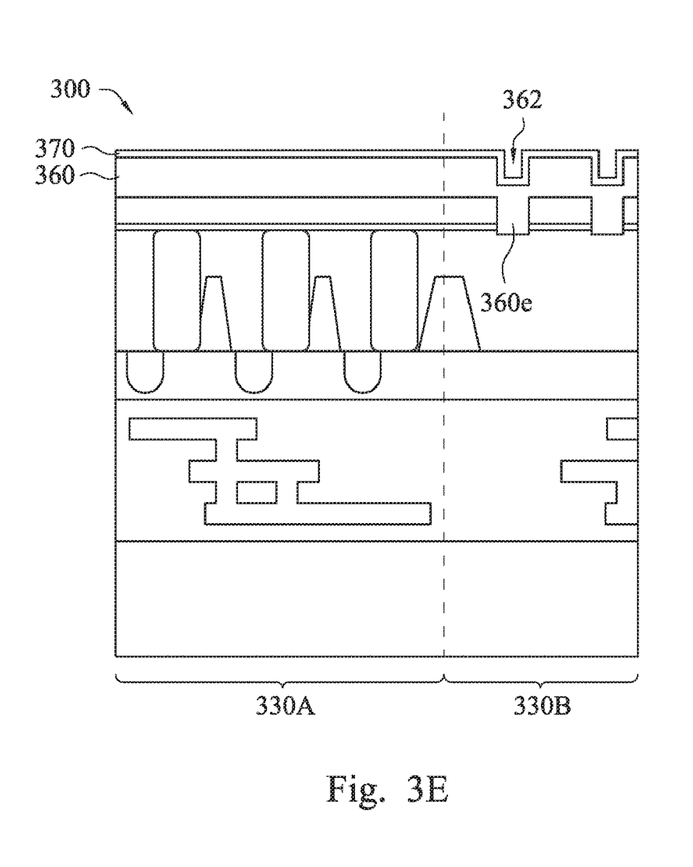

FIG. 3E is a cross-sectional view of image sensor 300 following operation 240. A protective layer 370 is formed continuously extending along a top surface, sidewalls and a bottom surface (i.e., sidewalls and a bottom surface of groove 362) of conductive layer 360. The formation of protective layer includes a thermal oxidation, ALD, HARP, pulse laser deposition, PICVD, evaporation, APCVD, LPCVD or another suitable process. In some embodiments, protective layer 370 includes one or more dielectric materials, such as tungsten oxide, aluminum oxide, molybdenum oxide, silicon oxide, silicon oxynitride, hydrocarbon, another suitable material or a combination thereof. In comparison with other approaches, protective layer 370 helps to prevent arcing phenomenon by smoothing a top surface and sidewalls of conductive layer 360 and covering a corner region at groove 362.

Figure 3F:
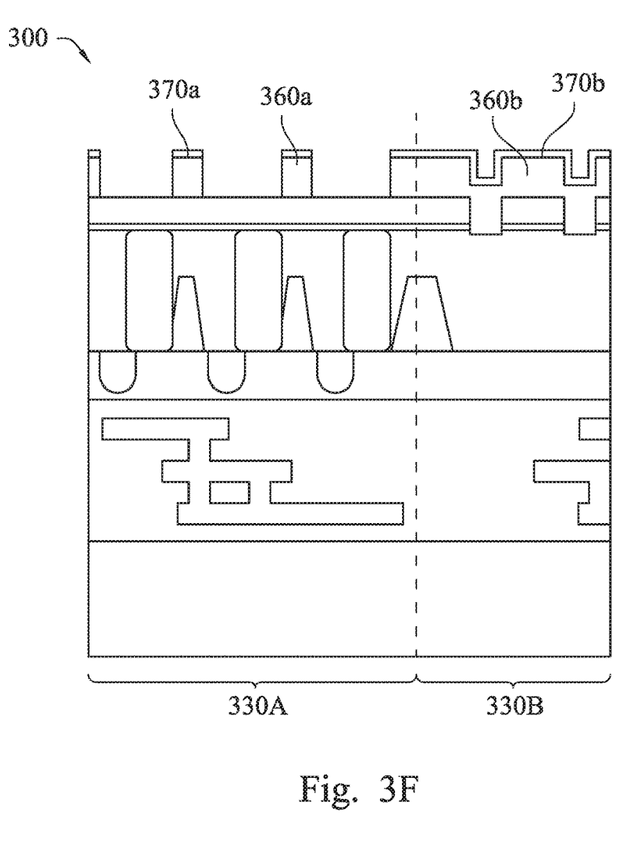

FIG. 3F is a cross-sectional view of image sensor 300 following operation 250. In some embodiments, a patterned photoresist is formed over protective layer 370 by processes of spin-on coating, exposure and developing. Next, by performing an etch process, a portion of conductive layer 360 is removed to form a grid structure in pixel region 330A. In some embodiments, the grid structure is aligned to each radiation detection device 316. Alternatively, prior to coating the photoresist, a hard mask layer such as an ashing removable dielectric (ARD) is formed over protective layer 370. In some embodiments, a thickness of ARD ranges from about 500 Å to about 1500 Å. The hard mask layer is patterned to define the grid structure. Next, the hard mask is completely removed by an etch process, for example, using a plasma-assisted etching.

Figure 3G:
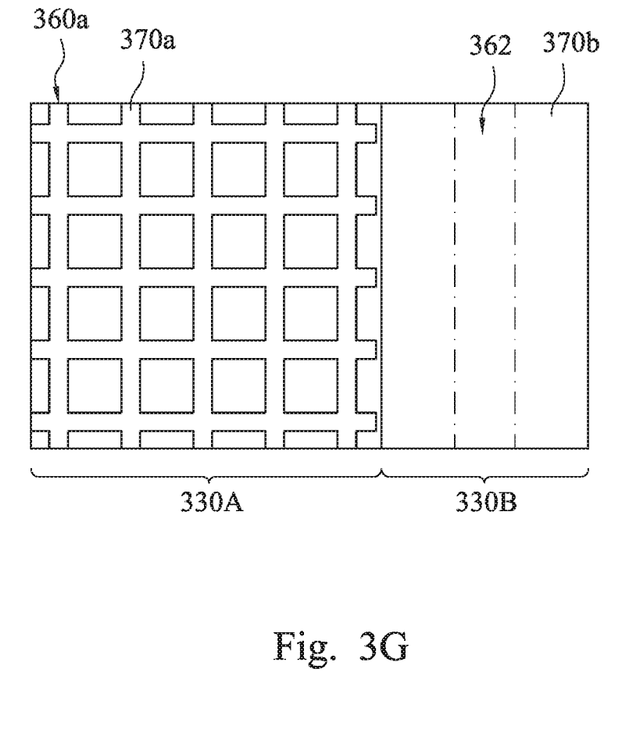

FIG. 3G is a top view of image sensor 300 following operation 250. In pixel region 330A, protective layer 370a and underlying conductive layer 360a are configured as multiple enclosures, e.g., rectangles (although other polygons are applicable), thereby forming a two-dimensional grid matrix. Logic circuits are arranged in dark region 330B, which also includes dummy patterns to cover the region peripheral to pixel region 330A, in some instances.

Figure 4:
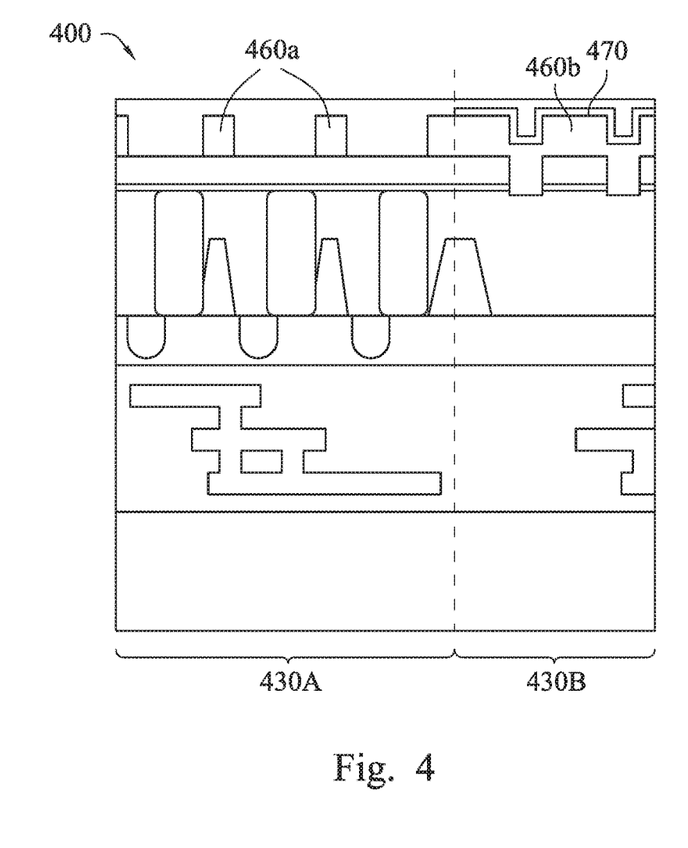
FIG. 4 is a cross-sectional view of an image sensor in accordance with one or more embodiments.

FIG. 4 is a cross-sectional view of an image sensor 400 in accordance with one or more embodiments. Image sensor 400 includes elements similar to image sensor 100 and a last two digits of like elements are the same. In comparison with image sensor 300, in a pixel region 430A image sensor 400 is free of a protective layer. In some embodiments, a protective layer 470 is not formed in pixel region 430A during operation 240. In some embodiments, a portion of protective layer 470 formed in pixel region 430A is completely removed during or after operation 250.

Figure 5:
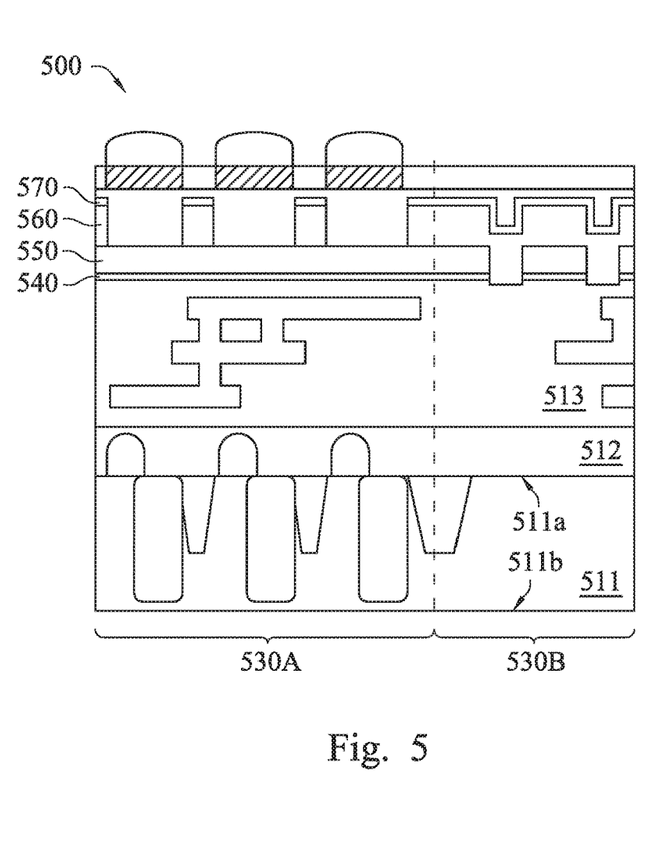
FIG. 5 is a cross-sectional view of an image sensor in accordance with one or more embodiments.

FIG. 5 is a cross-sectional view of an image sensor 500 in accordance with one or more embodiments. Image sensor 500 includes elements similar to image sensor 100 and a last two digits of like elements are the same. In comparison with image sensor 300, image sensor 500 is a FSICIS. Therefore, in FIG. 5, a charge accumulation layer 540, a buffer layer 550, a conductive layer 560 and a protective layer are formed at a first side 511a of a device substrate 511. In at least one embodiment, a thinning process to a second side 511b is negligible because of no carrier substrate is bonded to device substrate 511. One of ordinary skill in the art would understand that, similar to image sensor 400, image sensor 500 is free of protective layer in a pixel region 530A.

One aspect of this description relates to a method of fabricating an image sensor. The method includes depositing a first dielectric layer over a substrate, removing a portion of the first dielectric layer from the substrate to form a trench, and depositing a conductive layer over the first dielectric layer and in the trench, wherein a groove corresponding to the trench is formed in the conductive layer. The method further includes forming a protective layer lining a top surface of the conductive layer and sidewalls and a bottom surface of the groove in the conductive layer, and removing a portion of the conductive layer to form a grid structure.

Another aspect of this description relates to a method of manufacturing a CIS. The method includes forming a radiation detection device in a device substrate, forming an interconnect structure on a first side of the device substrate, depositing a conductive layer over the device substrate, lining a protective layer over the conductive layer, continuously extending along sidewalls and a bottom surface of a groove formed in the conductively layer, and removing a portion of the conductive layer and a portion of the protective layer.

Still another aspect of this description relates to an image sensor. The image sensor includes a substrate having a first region and a second region, a dielectric layer over the substrate, and a conductive layer over the dielectric layer, wherein in the first region the conductive layer has a grid shape and in the second region a portion of the conductive layer is concave toward the substrate. The image sensor further includes a protective layer, wherein the protective layer is over the conductive layer in the first region, and over a top surface and along sidewalls of the conductive layer in the second region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating an image sensor, comprising:
depositing a first dielectric layer over a substrate;
removing a portion of the first dielectric layer from the substrate to form a trench;
depositing a conductive layer over the first dielectric layer and in the trench, wherein a groove corresponding to the trench is formed in the conductive layer;
forming a protective layer lining a top surface of the conductive layer and sidewalls and a bottom surface of the groove in the conductive layer; and
removing a portion of the conductive layer to form a grid structure.

2. The method of claim 1, wherein forming the protective layer comprises:
flowing an oxygen-containing gas at a rate ranging from about 1000 sccm to about 27000 sccm; and
raising a chamber temperature to a temperature ranging from about 300 degrees Celsius to about 600 degrees Celsius.

3. The method of claim 2, wherein flowing the oxygen-containing gas comprises:
flowing oxygen at a rate ranging from about 3000 sccm to about 25000 sccm; and
flowing ozone at a rate ranging from about 1000 sccm to about 27000 sccm.

4. The method of claim 1, wherein forming the protective layer comprises:
forming the protective layer at a pressure ranging from about 500 Torr to about 700 Torr.

5. The method of claim 1, wherein forming the protective layer comprises:
performing an atomic layer deposition (ALD).

6. The method of claim 1, wherein forming the protective layer comprises:
forming the protective layer having a thickness ranging from about 20 angstrom (Å) to about 80 Å.

7. The method of claim 1, wherein removing the portion of the conductive layer comprises:
depositing an ashing removable dielectric (ARD) layer over the protective layer;
patterning the ARD layer to form a hard mask layer; and
etching the portion of the conductive layer to form the grid structure using the hard mask layer.

8. A method of manufacturing a complementary metal-oxide-semiconductor (CMOS) image sensor (CIS) comprising:
forming a radiation detection device in a device substrate;
forming an interconnect structure on a first side of the device substrate;
depositing a conductive layer over the device substrate;
lining a protective layer over the conductive layer, continuously extending along sidewalls and a bottom surface of a groove formed in the conductive layer;
removing a portion of the conductive layer and a portion of the protective layer, wherein the removing of the portion of the protective layer comprises maintaining the protective layer along sidewalls of the groove in the conductive layer.

9. The method of claim 8, wherein lining the protective layer over the conductive layer comprises:
performing high aspect ratio process (HARP) to form a metallic oxide over the conductive layer.

10. The method of claim 8, wherein lining the protective layer comprises:
performing pulse laser deposition (PLD) to form a dielectric layer over the conductive layer.

11. The method of claim 8, wherein lining the protective layer comprises:
performing photo induced chemical vapor deposition (PICVD) to form a dielectric layer over the conductive layer.

12. The method of claim 8, wherein depositing the conductive layer comprises:
depositing tungsten to a thickness ranging from about 1000 Å to about 3000 Å.

13. The method of claim 8, wherein depositing the conductive layer comprises:
depositing the conductive layer on a second side of the device substrate, wherein the second side is opposite to the first side.

14. The method of claim 8, wherein depositing the conductive layer comprises:
depositing the conductive layer on the first side of the device substrate, wherein the conductive layer is over the interconnect structure.

15. The method of claim 8, further comprising:
bonding the device substrate to a carrier substrate; and
thinning a thickness of the device substrate on a second side, wherein the second side is opposite to the first side.

16. The method of claim 8, further comprising:
depositing a charge accumulation layer over the device substrate;
forming a color filter and a microlens over the device substrate, wherein the color filter and the microlens are aligned to the radiation detection device.

17. A method of fabricating an image sensor, comprising:
depositing a charge accumulation layer over an entirety of the substrate
depositing a dielectric layer over the charge accumulation layer;
etching the charge accumulation layer and the dielectric layer to expose a portion of the substrate;
depositing a conductive layer over the dielectric layer, wherein the depositing of the conductive layer forms a groove in the conductive layer corresponding to a location of the exposed portion of the substrate;

removing a portion of the conductive layer over a first region of the substrate to form a grid structure; and maintaining the conductive layer over an entirety of a second region of the substrate.

18. The method of claim 17, wherein the etching of the charge accumulation layer and the dielectric layer comprises recessing the exposed portion of the substrate.

19. The method of claim 17, further comprising etching the dielectric layer over the first region of the substrate to from a dielectric grid pattern corresponding to the grid pattern.

20. The method of claim 17, wherein depositing the conductive layer comprises depositing the conductive layer to directly contact the exposed portion of the substrate.

* * * * *